United States Patent [19]
Yuasa

[11] Patent Number: 6,018,271
[45] Date of Patent: Jan. 25, 2000

[54] AMPLIFIER CIRCUIT WITH WIDE DYNAMIC RANGE AND LOW POWER CONSUMPTION

[75] Inventor: Tachio Yuasa, Kawasaki, Japan

[73] Assignee: Fujitsu Limited, Kanagawa, Japan

[21] Appl. No.: 09/357,167

[22] Filed: Jul. 19, 1999

Related U.S. Application Data

[62] Division of application No. 08/848,674, Apr. 29, 1997.

[30] Foreign Application Priority Data

Dec. 20, 1996  [JP]  Japan .................... 8-341972

[51] Int. Cl.[7] ...................................... H03F 3/26
[52] U.S. Cl. ........................................ 330/288; 330/264
[58] Field of Search ................... 330/255, 263, 330/264, 288, 267, 268

[56] References Cited

U.S. PATENT DOCUMENTS

| | | | |
|---|---|---|---|
| 4,045,747 | 8/1977 | Hsu ..................................... | 330/288 X |
| 4,375,619 | 3/1983 | Saari ................................... | 330/255 X |
| 4,818,901 | 4/1989 | Young et al. ....................... | 330/288 X |
| 5,165,054 | 11/1992 | Platt et al. ......................... | 330/288 X |
| 5,589,798 | 12/1996 | Harvey ............................... | 330/263 |
| 5,606,287 | 2/1997 | Kobayashi et al. .................... | 330/255 |
| 5,659,266 | 8/1997 | Shacter et al. ....................... | 330/267 |
| 5,754,078 | 5/1998 | Tanagawa ............................. | 330/264 X |

OTHER PUBLICATIONS

Holman et al., "Low Voltage Performance of a Low Noise Operational Amplifier in a 1.2 Mum Digital CMOS Technology", Proceedings of the 37th Midwest Symposium on Circuits and Systems, vol. 1, 3–5, Aug. 1994, Lafayette, LA USA, XP000531988, pp. 111–114, pp. 112–113; Figure 4.

Anghinolfi et al., "ICON, a Current Mode 5–7 Preamplifier iN CMOS Technology for Use With High Rate Particle Detectors" Conference Record of the 1991 IEEE Nuclear Science Symposium and Medical Imaging Conference, vol. 1 of 3, 2–9, Nov. 1991, Santa Fe<NM; USA, pp. 629–633, XP000347918, pp. 629–631, Figures 2A–2B.

"CMOS Class–AB Current Mirrors for Precision Current––Mode Analog–Signal–Processing Elements", IEEE Transaction on Circuits and Systems III: Analog and Digital Signal Processing, vol. 43, No. 12, Dec. 1996, pp. 843–845, XP000686178, pp. 843–844, Figures 1 and 4.

*Primary Examiner*—Steven J. Mottola
*Attorney, Agent, or Firm*—Nikaido Marmelstein Murray & Oram LLP

[57] ABSTRACT

A novel amplifier circuit having a wide output signal amplitude range and a small current consumption is disclosed. A signal conversion circuit converts the input signal thereof into a first current signal. A current calculation circuit calculates the difference between a predetermined current value and the first current signal. A current amplifier circuit amplifies the difference current. Since the difference current calculated by the current calculation circuit is amplified, the dynamic range of the output can be widened with a small current flowing in the signal conversion circuit and the current calculation circuit. Further, this amplifier circuit, if designed to supply no output current under no load, can reduce the current consumption since the only steady current that flows under that condition is the small one flowing in the signal conversion circuit and the current calculation circuit.

5 Claims, 8 Drawing Sheets

AMPLIFIER CIRCUIT WITH WIDE DYNAMIC RANGE AND LOW POWER CONSUMPTION

This application is a Division of Ser. No. 08/848,674, filed Apr. 29, 1997.

BACKGROUND OF THE INVENTION

1. Field of the Invention

The present invention relates to an amplifier circuit for amplifying internal signals or input/output signals of electronic equipment and devices or, in particular, to an amplifier circuit constituting an output stage of an operational amplifier used for signal processing in an analog electronic circuit.

2. Description of the Related Art

In conventional class-A operational amplifier circuits, the no-load output potential is set to a point intermediate between a supplied voltage using a current of a constant current source and a current supplied from a current-conversion transistor for converting the current of the output voltage of a differential amplifier circuit. The current of the current-conversion transistor and the current of the constant current source determine the driving capability of the output of the particular amplifier circuit. The larger the magnitude of these currents, therefore, the more the impedance can be reduced that can drive the signal amplitude as a load. Under no load or under a voltage load requiring no output current, however, the currents of a current-conversion transistor flow directly from the high potential side to the ground, thereby increasing the current consumed by the circuit. These currents must be reduced in order to reduce the power consumption of the amplifier circuit. The problem, however, is that a reduced current leads to a reduced drive capability.

Further, an attempt to increase the dynamic range (amplitude range) of the output current is accompanied by the requirement of considerably changing the output voltage of the differential amplifier circuit supplying a gate voltage to the current conversion transistor. For the output voltage amplitude of the differential amplifier circuit to be increased, on the other hand, the offset voltage between two input signal terminals increases unavoidably. As a result, an offset also occurs in the signal applied through the circuit, thereby posing the problem of crossover distortion.

SUMMARY OF THE INVENTION

Accordingly, the object of the present invention is to provide an amplifier circuit having a wide amplitude range of the output signal with a low current consumption.

According to the present invention, there is provided an amplifier circuit comprising a signal conversion circuit for converting the input signal to a first current signal, a current calculation circuit for calculating the difference current between a predetermined current value and the first current signal, and a current amplifier circuit for amplifying the difference current. In the amplifier circuit according to the invention, the difference current calculated in a current calculation circuit is amplified. Even when the currents flowing in the signal conversion circuit and the current calculation circuit are small, therefore, the dynamic range of the output can be widened. Further, in the case where the amplifier circuit is designed in such a manner that the output current is not supplied under no load, a small steady current flows only in the signal conversion circuit and the current calculation circuit under such a condition, thereby making it possible to reduce the whole current consumption.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Before proceeding to a detailed description of the preferred embodiments of the present invention, a prior art amplifier circuit will be described with reference to the accompanying drawings relating thereto for a clearer understanding of the differences between the prior art and the present invention.

Figure 1:
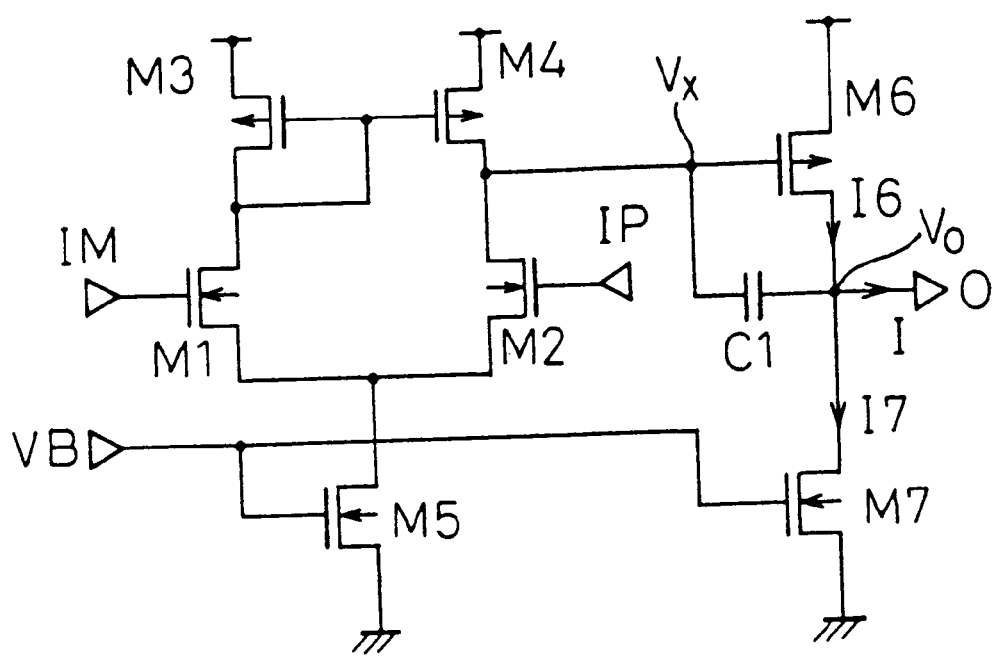
FIG. 1 is a circuit diagram showing a configuration of a conventional amplifier circuit.

FIG. 1 is a diagram showing a circuit configuration of a conventional amplifier circuit relating to the present invention. This circuit represents a typical example of a class-A operational amplifier circuit. Characters IP designates a non-inverted input terminal, character IM an inverted input terminal, characters VB an operation bias input terminal, and character O an output terminal. Transistors M1 to M5 constitute a differential amplifier circuit having a single-ended output Vx. A transistor M6 converts the output voltage Vx of the differential amplifier circuit Vx into a drain current. A transistor M7 acts as a constant current source and functions in such a manner that the potential of the output O under no load is set to about the intermediate level between the supplied voltage by the constant current supplied from the transistor M7 and the current flowing in the transistor M6.

A capacitor C1 is a phase-compensating capacitive element. The present invention has no relation to the operation of the phase-compensating capacitive element, and therefore the capacitor C1 will be nether explained nor illustrated in the description that follows.

Figure 2A:
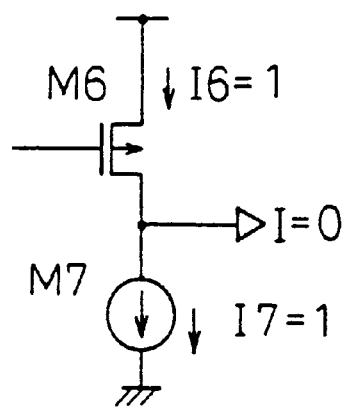
FIGS. 2A, 2B and 2C are diagrams for explaining the operation of a conventional amplifier circuit.
Figure 2B:
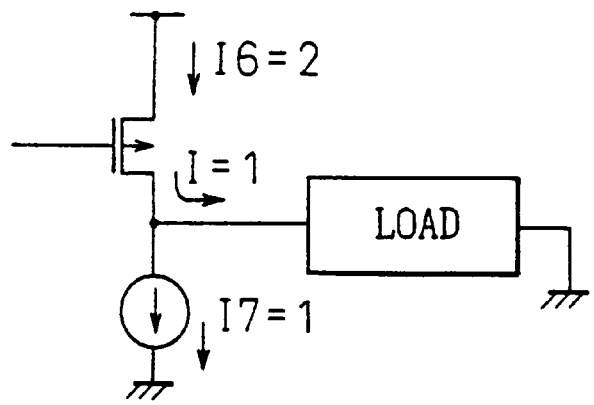
Figure 2C:
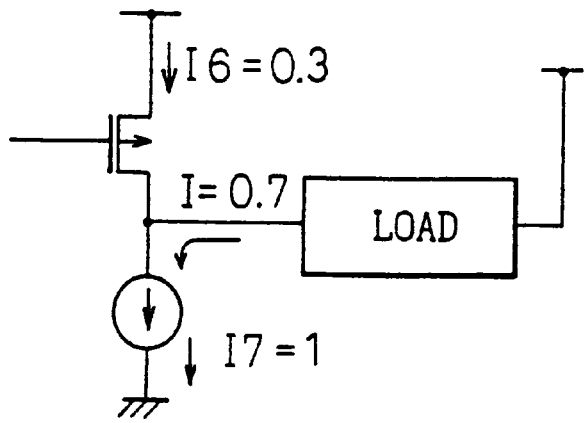

FIGS. 2A to 2C are diagrams for explaining the operation of the amplifier circuit shown in FIG. 1. FIG. 2A shows the state producing no output, FIG. 2B the state where a current is flowed from the amplifier circuit, and FIG. 2C the state where a current is absorbed into the amplifier circuit. The transistor M7 acts as a constant current source. The amplifier circuit is required to be designed to have an output potential substantially one half of the supplied voltage in the case where the signal input terminals IP and IM have the same potential. This in turn requires that the currents I6 and I7 flowing in the transistor M6 and M7 are equal to each other. This state is shown in FIG. 2A, in which the current I6 flowing in the transistor M6 is supplied directly to the transistor M7 as a current I7, and therefore no output current appears. In the case where a load is driven by flowing the current from this amplifier circuit, the voltage applied to the input terminal IP is increased or the voltage applied to the input terminal IM is decreased so as to decrease the voltage applied to the control electrode gate of the transistor M6. As a result, as shown in FIG. 2B, I6 increases and a current I equivalent to the difference between I6 and I7 flows into the load. In the case where the amplifier circuit absorbs the current from the load, on the other hand, the voltage applied to IP is decreased or the voltage applied to IM is increased, thereby increasing the voltage applied to the control electrode gate of the transistor M6. Consequently, as shown in FIG. 2C, I6 decreases so that the current I equivalent to the difference between I7 and I6 flows out the load.

In this way, the currents I6 and I7 determine the drive capability of the output of this amplifier circuit. The larger the currents I6 and I7, the more is it possible to decrease the impedance capable of driving the signal amplitude as a load. Under no load or under a voltage load requiring no output current, however, a current equivalent to I6 (I7) flows from high potential side of the power supply directly to the ground. With the increase in I6 and I7, therefore, a larger current is consumed by the circuit. In portable electronic equipment and devices, the use of which has widely spread in recent years, the LSI has been introduced to the circuits to reduce the size and weight and a battery is used for a power supply. The battery life is a crucial factor for the portable electronic equipment and devices with a reduced power consumption are desired. In view of this, it is necessary to reduce the current consumption of each circuit. The reduction in the current consumption of the amplifier circuit makes it necessary to reduce both the currents I6 and I7 described above. In spite of this, the reduction in I6 and I7 poses the problem of a lower drive capability.

Consider, for example, the case in which a current is flowed from the amplifier circuit to drive a load. As far as such a case is concerned, the output current I is given as I6–I7, indicating that a larger I6 and a smaller I7 are desirable. An excessively large difference between I6 and I7, however, undesirably increases the difference of I6 between when the amplifier circuit is under no load with I6 equal to I7 and when the output is at maximum. In this way, an attempt to increase the dynamic range (amplitude range) of the output current I requires a large change in the output voltage of the differential amplifier circuit Vx supplying the gate voltage of the transistor M6. An attempt to increase the output voltage amplitude of the differential amplifier circuit, on the other hand, unavoidably increases the offset voltage between the two input signal terminals IP and IM. With the increase in the offset voltage of the operational amplifier circuit, the signal passing through the circuit also contains an offset, thereby causing crossover distortion.

The same is true in the case where a current is absorbed into the amplifier circuit from a load. As shown in FIG. 2C, I6 can be minimized, for example, only to about three tenths of the value thereof under steady state (when I6=1). The dynamic range of the output current I thus is limited.

Figure 3:
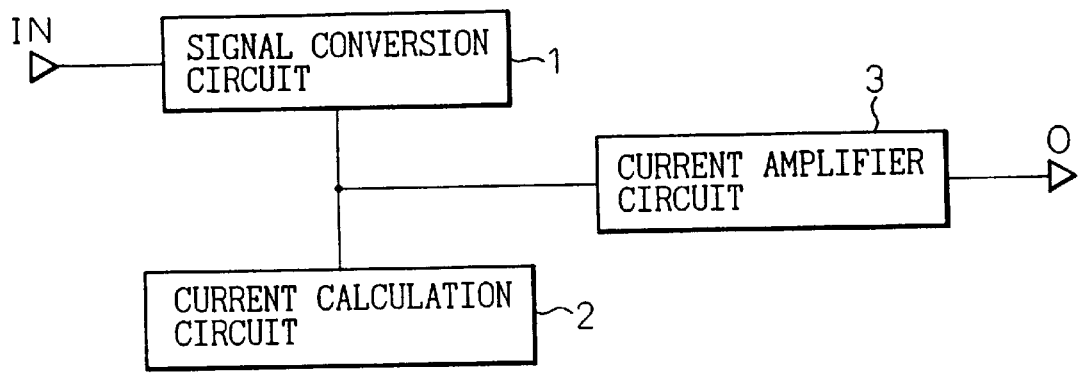
FIG. 3 is a diagram for explaining the basic configuration of the present invention.

FIG. 3 is a diagram showing a basic configuration of an amplifier circuit according to the invention. As shown in FIG. 3, the amplifier circuit according to the invention comprises a signal conversion circuit 1 for converting the input signal to a first current signal, a current calculation circuit 2 for calculating the difference current between a predetermined current value and the first current signal, and a current amplifier circuit 3 for amplifying the difference current. The signal conversion circuit 1 includes a transistor, and an input signal is applied to the control electrode of the transistor, while the first current signal is output from one of the controlled electrodes of the transistor. The current calculation circuit 2 is a constant current source for calculating the difference and producing a difference current between the current value of the constant current source and the first current signal. The current amplifier circuit 3 includes a current mirror circuit. In the amplifier circuit according to the invention, the difference current calculated by the current calculation circuit 2 is amplified. Even in the case where the current flowing in the signal conversion circuit 1 and the current calculation circuit 2 is small, therefore, the dynamic range of the output can be widened. Further, with an amplifier circuit designed in such a manner that no output current flows under no load, the current flowing steadily under such a condition is the small one flowing in the signal conversion circuit 1 and the current calculation circuit 2, thus making it possible to reduce the current consumption.

Figure 4:
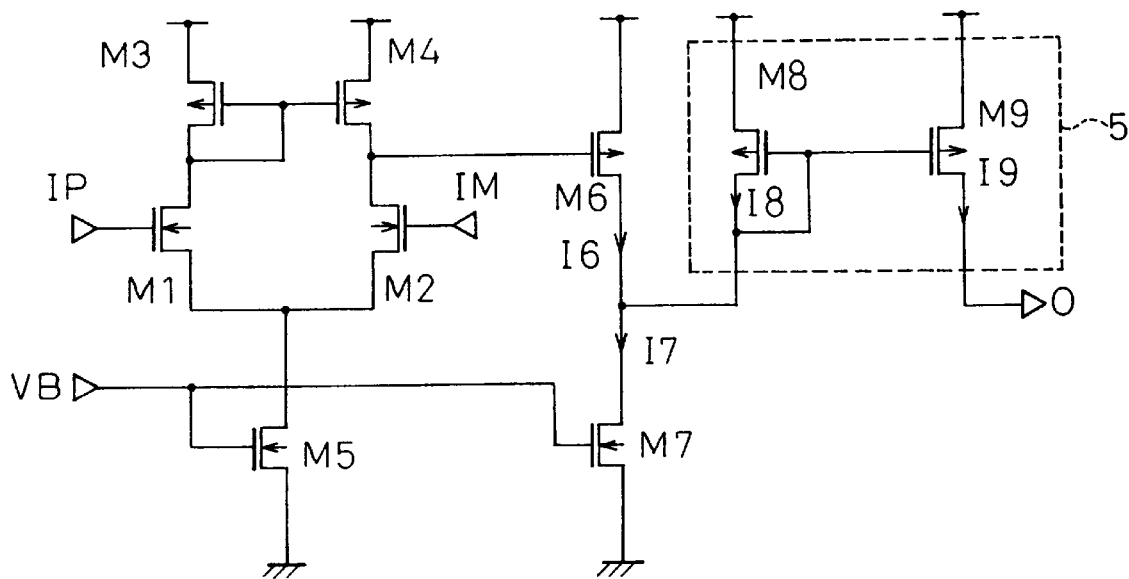
FIG. 4 is a circuit diagram showing a configuration of an amplifier circuit according to a first embodiment.

FIG. 4 is a diagram showing a circuit configuration of the first embodiment. As shown in FIG. 4, the circuit portion including the transistors M1 to M7 is identical to the corresponding portion in FIG. 1. The connecting point between the transistors M6 and M7 is connected with an amplifier circuit consisting of the transistors M8 and M9. As described above, the transistors M1 to M5 make up a differential amplifier circuit having a single ended output. The transistor M6 is the portion for converting the output voltage of the differential amplifier circuit to a current and corresponds to the signal conversion circuit 1 in FIG. 3. The transistor M7, which operates as a constant current source for supplying a constant current, is the portion functioning to absorb the summation of the constant current and the current of the transistor M6 from the transistor M8 and corresponds to the current calculation circuit 2 in FIG. 3. The portion 5 made up of the transistors M8 and M9, on the other hand, constitutes a current amplifier circuit called the current mirror circuit for determining the ratio of the current I9 flowing out the transistor M9 with respect to the current I8 flowing out the transistor M8 according to the size of the transistor or the like. In the case under consideration, the ratio is I8:I9=1:m. The first embodiment involves the value m=10, for example.

Figure 5A:
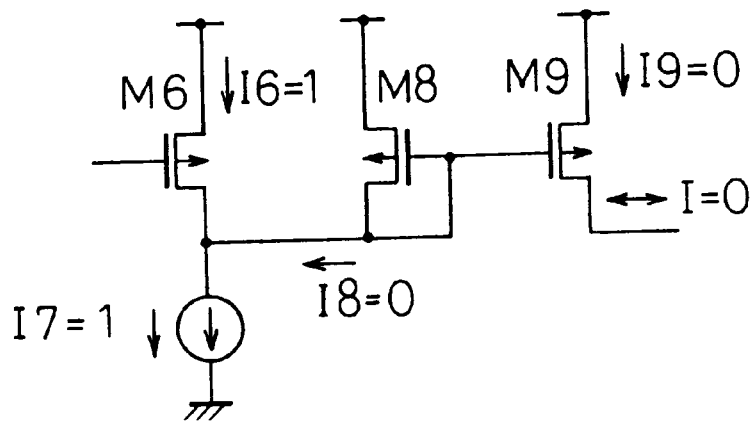
FIGS. 5A and 5B are diagrams for explaining the operation of the amplifier circuit according to the first embodiment.
Figure 5B:
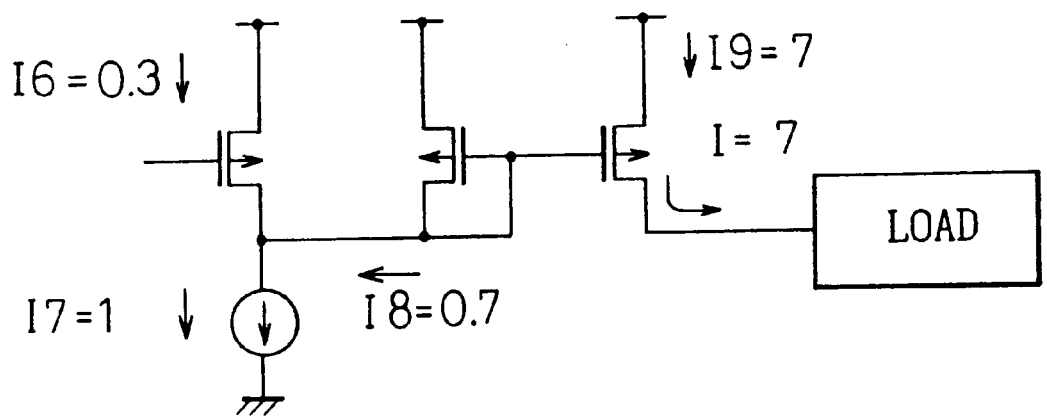

FIGS. 5A and 5B are diagrams for explaining the operation of the amplifier circuit according to the first embodiment. With reference to FIGS. 5A and 5B, the operation of the amplifier circuit according to the first embodiment shown in FIG. 4 will be explained. As described above, the transistor M7 corresponds to the current calculation circuit 2 and operates as a constant current source. The relation I7=I6+I8 holds between the current I7 flowing in the transistor M7 and the current I8. For facilitating the understanding in the circuits of FIGS. 1 and 4, all the transistors M1 to M7 are assumed to be equal to each other with an equal bias voltage VB. This relation leads to I8=I7–I6 and I9=m×I8= m×(I7–I6). As in the case of FIG. 1, the conditions are set to assure that I6=I7 when the potential is equal between IP and IM. In the case where I6=I7, I8 is zero, so that I9 is also zero as shown in FIG. 5A. No current output, therefore, is produced. In other words, in the absence of output as in the case of (1) in FIG. 5, I6 (I7) is the only current which flows in the circuit and is considered the same as the current flowing in the circuit of FIG. 1.

As shown with reference to FIG. 2C, on the other hand, the reduction in the output current of M6 is limited if the input offset voltage is to be within a predetermined value. Assume that the reduction is −ΔI6. In FIG. 2C, ΔI6 is given as 7/10×I7. Similarly, the reduction ΔI6 is expressed as 7/10×I7 in FIG. 5B. In the case where I6 is given as 3/10×I7 as shown in FIG. 5B, I8 is 7/10×I7, and I9 is m×ΔI6. The current I flowed from the amplifier circuit can thus be expressed as m×I7−m×(I6−ΔI6)=m×ΔI6 (here I7=I6). In other words, the dynamic range of the output is increased by a factor of m. The absorption amplitude is 0.7 for the circuit of FIG. 2C, and the flowed amplitude is 7 for the circuit of FIG. 5B. In both cases, m is ten times as large.

As described above, in the circuit according to the first embodiment, the dynamic range (amplitude range) of the output current can be increased without increasing the current consumption. With the circuit shown in FIG. 4, the logic for controlling the output current I from the differential amplifier circuit is reversed to that for the circuit of FIG. 1, and so is the relation between the input terminals IP and IM.

Figure 6:
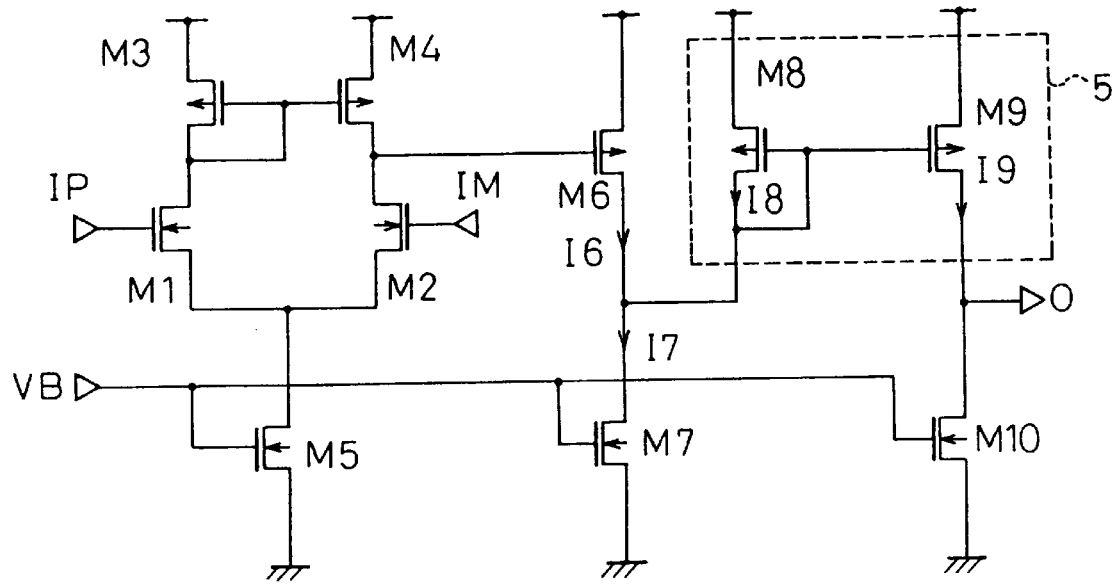
FIG. 6 is a diagram showing a configuration of a modification of the amplifier circuit according to the first embodiment.

In the setting described with reference to FIGS. 5A and 5B, only the amount of the current flowed to the load from the amplifier circuit undergoes a change while the current is not flowed from the load into the amplifier circuit. A simple method of solving this inconvenience is to insert a current source between the VSS and output O of the circuit shown in FIG. 4. An embodiment having such a configuration is shown in FIG. 6. A transistor M10 functions as such a current source.

Figure 7:
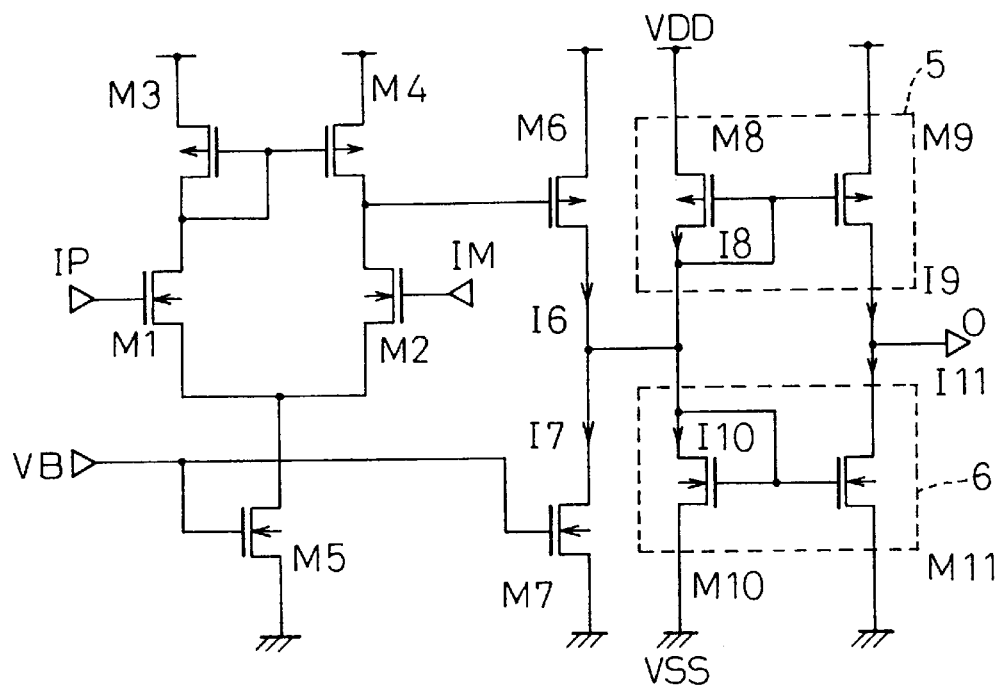
FIG. 7 is a circuit diagram showing a configuration of an amplifier circuit according to a second embodiment of the invention.

FIG. 7 is a diagram showing a configuration of an amplifier circuit according to a second embodiment. The circuit of the second embodiment includes, in addition to the circuit components of the first embodiment, a current mirror circuit 6 configured of transistors M10 and M11 providing N-channel MOSFETs as a complementary configuration to the transistors M8 and M9. This current mirror circuit 6 is equivalent to the current mirror circuit 5 including the transistors M8 and M9 constituting a P-channel MOSFET. This configuration makes up a push-pull setup of the output stage which can operate to supply the output current in the desired one of the directions from and into the amplifier circuit.

In the amplifier circuit according to the second embodiment, I8 and I10 are both zero when I6=I7. Hence, I9 and I11 are also zero. The current flowing under no load, therefore, is I6 (I7) which is the same as in the case of the conventional circuit shown in FIG. 1. This is an ideal case, and some current flows actually due to variations of characteristics between the transistors. In spite of this, such a current is normally minuscule.

Figure 8A:
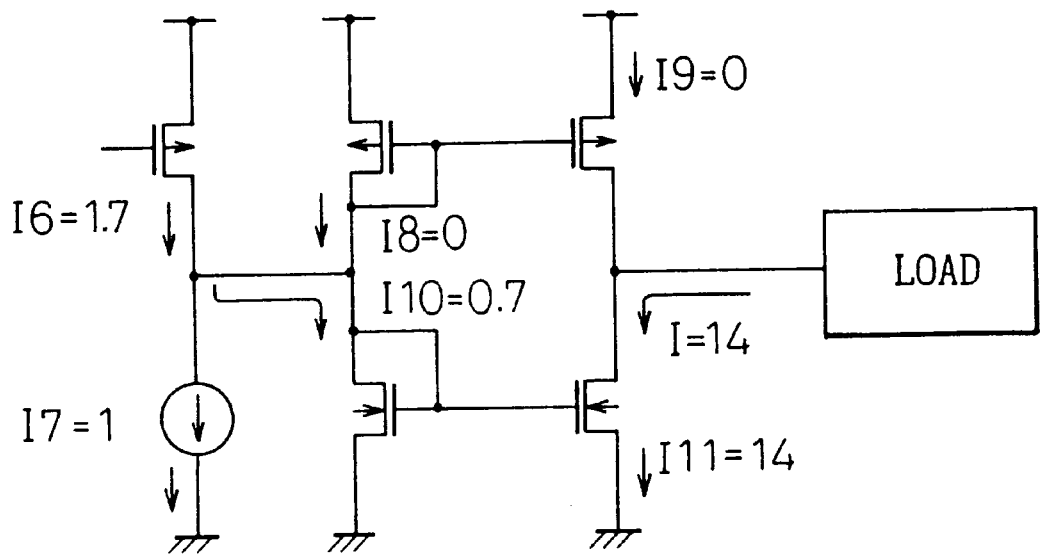
FIGS. 8A and 8B are diagrams for explaining the operation of the amplifier circuit according to the second embodiment.
Figure 8B:
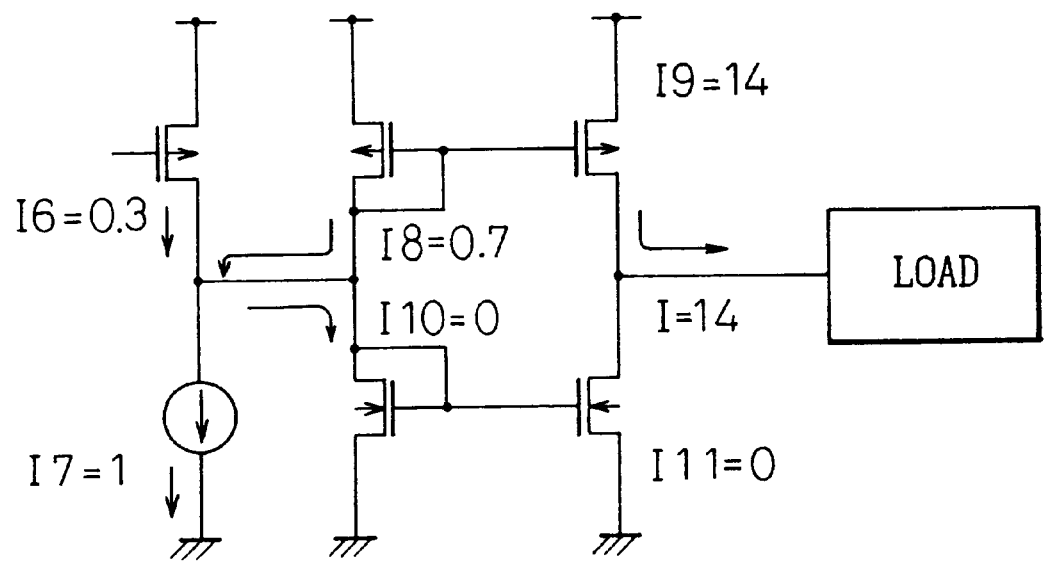

FIG. 8A shows the state of the amplifier circuit according to the second embodiment which operates in such a manner that the output current flows into the amplifier circuit. FIG. 8B shows the state of the amplifier circuit according to the second embodiment which operates in such a manner that the output current flows out of the amplifier circuit. In this circuit, the relation holds that I6+I8=I7+I10. Assume that I8:I9=I10:I11=1:m. The factor m is set 20, for example, in FIGS. 8A and 8B. From these equations, the relation is established that the output current I=I9−I11=−m(I6−I7). In this circuit, the transistor M7 acts as a constant current source. With the decrease in I6, therefore, I8 increases while I10 decreases. Accordingly, I9 increases and I11 decreases, with the result that a more output current I flows out from the amplifier circuit. With the increase in I6, in contrast, I8 decreases and I10 increases. At the same time time, I9 decreases and I11 increases, so that a more current I flows into the amplifier circuit. Assuming that the input offset voltage is not more than a predetermined value in the case where the change in the output current of the transistor M6 is ±6.6 I6, therefore, the fluctuation of the output current of the circuit is given as ±m×ΔI6. In the conventional amplifier circuit shown in FIG. 1, the fluctuation is ±ΔI6 indicating that the change of the output current is enlarged by a factor of m. In this way, the amplifier circuit according to the second embodiment permits the amplitude range of the output current to be increased in the two directions of flow-in and flow-out of the amplifier circuit without increasing the current consumption. With the circuit of the second embodiment, like that of the first embodiment, the logic of controlling the output current I from the differential amplifier circuit is reversed to that for the circuit of FIG. 1, and so is the relation between the input terminals IP and IM.

Figure 9A:
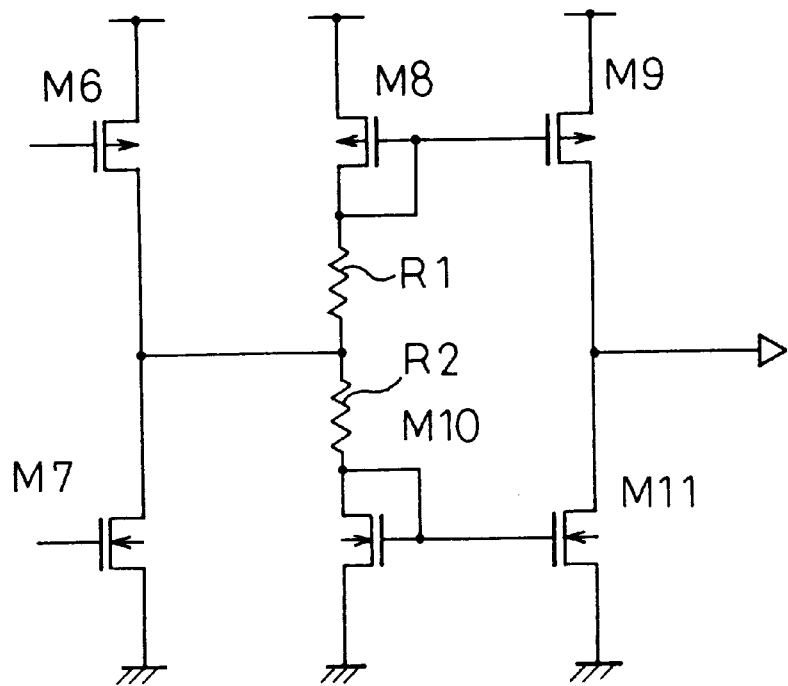
FIGS. 9A and 9B are circuit diagrams showing a configuration of modifications of the amplifier circuit according to the second embodiment.
Figure 9B:
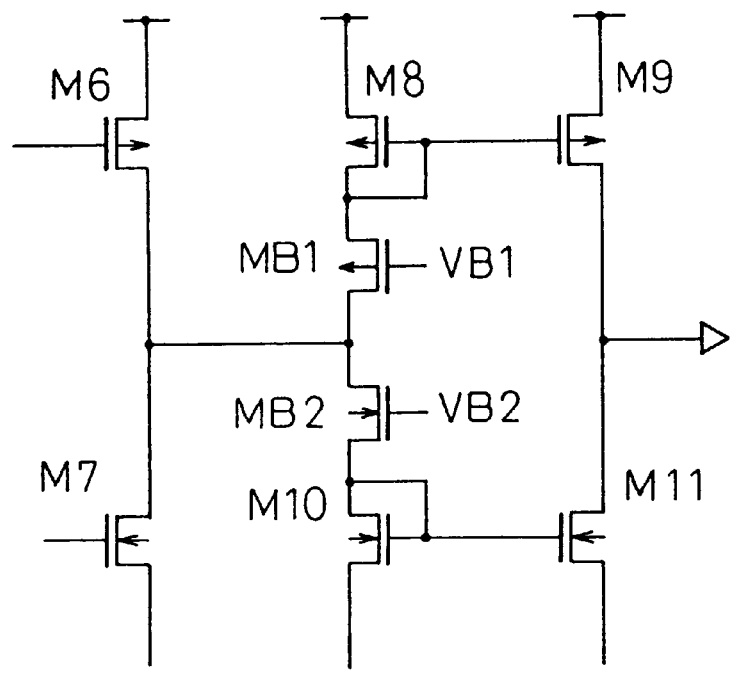

In the circuit according to the second embodiment shown in FIG. 7, the current flows from the high-potential side VDD of the power supply through the transistors M8 and M10 to the low-potential side VSS of the power supply, and there is no means available for controlling this current. For this reason, a large current flows in this route for an increased current consumption, sometimes resulting in a breakdown of the transistor or the like due to the heat generated. In order to obviate this problem, it is necessary to provide a current bias regulation circuit for limiting the current in this route. FIGS. 9A and 9B are diagrams showing modifications of the amplifier circuit according to the second embodiment including a current bias regulation circuit inserted in the above-mentioned route. FIG. 9A shows an example in which a resistor is inserted as a current bias regulation circuit, and FIG. 9B an example in which transistors MB1 and MB2 supplied with appropriate bias voltages VB1 and VB2 are inserted as a current bias regulation circuit. The current bias regulation circuit is not limited to these examples, but may take any form that can limit the current.

Figure 10:
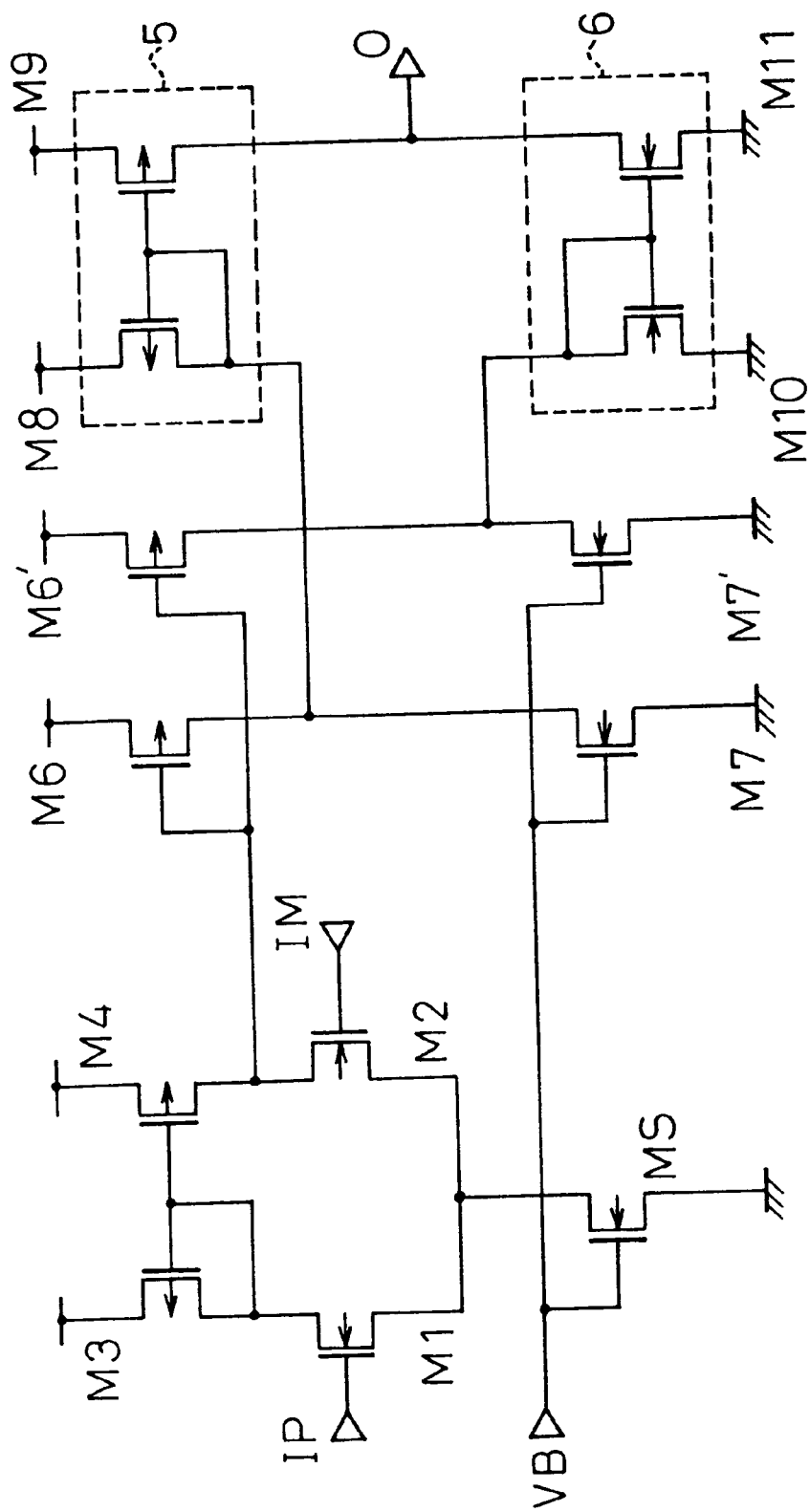
FIG. 10 is a circuit diagram showing a configuration of an amplifier circuit according to a third embodiment.

FIG. 10 is a diagram showing a configuration of an amplifier circuit according to a third embodiment. The differential amplifier circuit and the portion including the transistors M6 to M9 of this amplifier circuit are identical to the corresponding component parts of the first and second embodiments. The current mirror circuit 6 consisting of the transistors M10 and M11 also have the same function as the corresponding circuit of the second embodiment. This embodiment is different from the first and second embodiments in that a signal conversion circuit and a current calculation circuit including transistors M6' and M9' are inserted in addition to the signal conversion circuit and the current calculation circuit including M6 and M7, respectively, so that the current mirror circuit 5 including the transistors M8 and M9 is supplied with an input current from the signal conversion circuit and the current calculation circuit including M6 and M7, while the current mirror circuit including the transistors M10 and M11 is supplied with an input current from the signal conversion circuit and the current calculation circuit including M6' and M7', respectively. This configuration makes it possible for the two current mirror circuits combined to perform a push-pull operation like the current mirror circuit of the first embodiment. Since the bias current value of each current mirror circuit can be determined uniquely, it is not necessary to provide the current bias regulation circuit required in the circuit according to the second embodiment shown in FIG.

7. This is, however, at the expense of a current consumption increased by the amount flowing in the route formed by M6' and M7'. But the current consumption caused by M6' and M7' is still much smaller in the case that the dynamic range is widened by increasing I6 and I7 with the circuit in FIG. 1.

It will thus be understood from the foregoing description that according to the present invention there is provided an amplifier circuit which can increase the variation range of the output current as compared with the conventional amplifier circuit. Consequently, a high-performance portable electronic equipment or device consuming less power can be easily realized.

What is claimed is:

1. An amplifier circuit comprising:
    a signal conversion circuit for converting an input signal into a current signal;
    a current calculation circuit for calculating a difference current between a predetermined current value and said current signal;
    a first current amplifier circuit having an element of a first polarity for amplifying said difference current; and
    a second current amplifier circuit having an element of a second polarity for amplifying said difference current;
    wherein said first current amplifier circuit and said second current amplifier circuit are connected to each other in complementary configuration, and
    wherein an output of said amplifier circuit is directly obtained from a connection node of outputs of said first and second current amplifier circuits, and
    wherein voltage phases of an input and an output of said first current amplifier circuit are opposite to each other, and voltage phases of an input and an output of said second current amplifier circuit are opposite to each other.

2. An amplifier circuit according to claim 1, wherein said signal conversion circuit includes a transistor, said input signal is applied to a control electrode of said transistor, and said current signal is output from one of the controlled electrodes of said transistor.

3. An amplifier circuit according to claim 1,
    wherein said current calculation circuit is a constant current source, and a difference between the current value of said constant current source and said current signal is calculated as said difference current.

4. An amplifier circuit according to claim 1,
    wherein said current amplifier circuit includes a current mirror circuit.

5. An amplifier circuit according to claim 1, further comprising a current bias regulation circuit connected to a junction between said first current amplifier circuit and said second current amplifier circuit.

* * * * *